(12) United States Patent
Kim et al.

(10) Patent No.: US 8,314,764 B2
(45) Date of Patent: Nov. 20, 2012

(54) VOLTAGE AMPLIFIER AND DRIVING DEVICE OF DISPLAY DEVICE USING THE VOLTAGE AMPLIFIER

(75) Inventors: Byung-Doo Kim, Yongin-si (KR); Hee-Jong Park, Yongin-si (KR); Ju-Young No, Cheongju-si (KR); Sang-Hoon Lee, Uiwang-si (KR)

(73) Assignee: MC Technology Co., Ltd., Suwon-si (KR)

( * ) Notice: Subject to any disclaimer, the term of this patent is extended or adjusted under 35 U.S.C. 154(b) by 315 days.

(21) Appl. No.: 12/452,419

(22) PCT Filed: Jun. 24, 2008

(86) PCT No.: PCT/KR2008/003595
§ 371 (c)(1),
(2), (4) Date: Dec. 24, 2009

(87) PCT Pub. No.: WO2009/005239
PCT Pub. Date: Jan. 8, 2009

(65) Prior Publication Data
US 2010/0134462 A1    Jun. 3, 2010

(30) Foreign Application Priority Data
Jun. 29, 2007  (KR) .................. 10-2007-0065140

(51) Int. Cl.
G09G 3/36    (2006.01)
(52) U.S. Cl. .......................................... 345/98; 345/211
(58) Field of Classification Search .................. 345/211, 345/87, 98–100, 204
See application file for complete search history.

(56) References Cited

U.S. PATENT DOCUMENTS

| | | | |
|---|---|---|---|
| 2003/0103029 A1* | 6/2003 | Kokubun et al. | ................ 345/99 |
| 2005/0017809 A1 | 1/2005 | Ueno et al. | |
| 2005/0068105 A1 | 3/2005 | Shimatani | |

(Continued)

FOREIGN PATENT DOCUMENTS

JP  08-321731  12/1996

(Continued)

*Primary Examiner* — Stephen Sherman
(74) *Attorney, Agent, or Firm* — Lexyoume IP Meister, PLLC.

(57) ABSTRACT

An amplifying circuit of a display device including a plurality of pixels includes an input unit, a bias unit, and an output unit. The input unit is coupled between a first power source for supplying a first voltage and a second power source for supplying a second voltage, receives a first input signal and a second input signal, and is controlled by the first and second input signals. The bias unit receives a bias voltage for operating the input unit, and includes a first node and a second node controllable by the input unit. The output unit applies an output voltage to a pixel by using a first output transistor turned on/off by a signal applied to the first node and a second output transistor turned on/off by a signal applied to the second node, and the first output transistor is a different type to the second output transistor. In this instance, the input unit includes a first input transistor having a first terminal coupled to a first power source and being turned on/off by a first input signal and a second input transistor of the same type as the first input transistor, having a first terminal coupled to the first power source, and being turned on/off by a second input signal. The bias unit includes a first transistor controllable by the on/off state of the first input transistor and a second transistor controllable by the on/off state of the second input transistor.

9 Claims, 21 Drawing Sheets

U.S. PATENT DOCUMENTS

2005/0206642 A1   9/2005   Kushima et al.

FOREIGN PATENT DOCUMENTS

| | | |
|---|---|---|
| JP | 2001-244761 | 9/2001 |
| JP | 2002-280895 | 9/2002 |
| JP | 2005-338131 | 12/2005 |
| JP | 2006-337961 | 12/2006 |
| JP | 2007-116497 | 5/2007 |
| KR | 1020060065048 | 6/2006 |
| KR | 1020070007669 | 1/2007 |

* cited by examiner

VOLTAGE AMPLIFIER AND DRIVING DEVICE OF DISPLAY DEVICE USING THE VOLTAGE AMPLIFIER

TECHNICAL FIELD

The present invention relates to an amplifying circuit and a driving device of a display device using the same. More particularly, the present invention relates to an amplifying circuit having less power consumption, a reduced area, and the same electrical characteristics as a conventional circuit.

BACKGROUND ART

Recently, as personal computers and televisions have been become lighter and slimmer, display devices have also been required to become lighter and slimmer, and flat displays such as liquid crystal displays (LCD) other than cathode ray tubes (CRT) have been increasingly researched according to the requirements.

The liquid crystal display (LCD) is a display device for acquiring a desired video signal by applying an electric field to a liquid crystal material having an anisotropic dielectric constant and injected between two substrates, controlling an intensity of the electric field, and controlling the light transmitted to the substrates from an external light source (a back light).

The liquid crystal display (LCD) is representative of the portable flat panel displays, and a thin film transistor liquid crystal display (TFT-LCD) using a thin film transistor (TFT) as a switch is mainly used.

The liquid crystal display (LCD) applies a voltage to the two electrodes to generate an electric field on a liquid crystal layer, controls the intensity of the electric field to control the transmittance of the light passing through the liquid crystal layer, and thereby acquires a desired image. The liquid crystal display (LCD) inverts the voltage polarity of a data signal for a common voltage (Vcom) for each frame, row, or pixel in order to prevent a degradation phenomenon that occurs when an electric field is applied in one direction to the liquid crystal layer for a long time.

In this instance, the voltage of the data signal is transmitted to the liquid crystal layer through a data driver including an amplifying circuit for amplifying the voltage of the data signal.

The amplifying circuit is disclosed in Korean Patent No. 10-2005-0030570, and the disclosed conventional amplifying circuit has an inverting input terminal coupled to a pair of input transistors having different two types and a non-inverting input terminal coupled to a pair of input transistors of two different types according to a rail-to-rail structure. The conventional amplifying circuit will now be described with reference to FIG. 1 and FIG. 2.

FIG. 1 shows a brief conventional amplifying circuit.

As shown in FIG. 1, the conventional amplifying circuit 1 generates an output voltage by using an amplifier 40 and output transistors 31 and 32 of different types, and transmits a generated output voltage to a pixel (the pixel is not directly shown and a capacitor of the pixel is shown as Cp in FIG. 1). Also, the same voltage as the output voltage transmitted to the pixel is input to the inverting input terminal (−) of the amplifying circuit. In this instance, when an input voltage is applied to the non-inverting input terminal (+) of the amplifying circuit, the voltage of the pixel capacitor (Cp) is charged or discharged according to the input voltage applied to the non-inverting input terminal (+) and the previous output voltage input to the inverting input terminal (−).

FIG. 2 shows a conventional amplifying circuit in detail.

As shown in FIG. 2, the conventional amplifying circuit 1 includes an input unit 10, a bias unit 20, and an output unit 30. In FIG. 2, transistors 11, 12, 17, 18, 19_2, 23, 24, and 32 are N-channel field effect transistors (i.e., N-channel metal oxide semiconductors), and transistors 13, 14, 15, 16, 19_1, 21, 22, and 31 are P-channel field effect transistors (i.e., P-channel metal oxide semiconductors).

The input unit 10 includes the transistors 11, 12, 13, 14, 15, 16, 17, 18, 19_1, and 19_2, and bias voltages BV1 and BV6 are applied to the transistors 19_1 and 19_2. In this instance, the amplifying circuit of the rail-to-rail structure has an inverting input terminal (−) coupled to gate electrodes of the transistors 11 and 13, and a non-inverting input terminal (+) coupled to gate electrodes of the transistors 12 and 14.

The bias unit 20 includes transistors 21, 22, 23, and 24 to which bias voltages BV2, BV3, BV4, and BV5 are applied.

The output unit 30 includes transistors 31 and 32 and capacitors 33 and 34. A gate electrode of the transistor 31 is coupled to a node A and a gate electrode of the transistor 32 is coupled to a node B to transmit the output voltage.

Accordingly, the conventional amplifying circuit has a problem of increasing the area occupied by the input transistor from among the entire area of the amplifying circuit because of adopting the rail-to-rail structure, and generates a problem of increasing power consumption because constant current sources for the input transistors of different types must be used.

The above information disclosed in this Background section is only for enhancement of understanding of the background of the invention and therefore it may contain information that does not form the prior art that is already known in this country to a person of ordinary skill in the art.

DETAILED DESCRIPTION

Technical Problem

The present invention has been made in an effort to provide an amplifying circuit for reducing a number of input transistors and a driving device of a display device using the same.

Technical Solution

An exemplary embodiment of the present invention provides an amplifying circuit for a liquid crystal display (LCD) including a plurality of pixels, including: an input unit, coupled between a first power source for supplying a first voltage and a second power source for supplying a second voltage, for receiving a first input signal and a second input signal, and being controllable by the first and second input signals; a bias unit for receiving a bias voltage for operating the input unit, and including a first node and a second node controlled by the input unit; and an output unit for applying an output voltage to the pixel by using a first output transistor being turned on/off according to a signal applied to the first node and a second output transistor being turned on/off according to a signal applied to the second node, the second output transistor being different from the first output transistor. The input unit includes a first input transistor having a first terminal coupled to the first power source and being turned on/off according to the first input signal and a second input transistor having a first terminal coupled to the first power source and being turned on/off according to the second input signal, the second input transistor being the same type as the first input transistor, and the bias unit includes a first transistor controlled by the on/off state of the first input transistor, and a second transistor controlled by the on/off state of the second input transistor.

Another embodiment of the present invention provides a driving device of a display device including: a plurality of pixels defined by a plurality of scan lines to which a plurality of scan signals are applied and a plurality of data lines to which a plurality of data signals are applied; a positive amplifying circuit for symmetrically controlling a period for charging a first output voltage in the pixel and a period for discharging the first output voltage charged in the pixel by using a first input transistor that is turned on/off according to a first input signal and a second input transistor that is turned on/off according to a second input signal, the second input transistor being the same type as the first input transistor; and a negative amplifying circuit for symmetrically controlling a period for charging the second output voltage in the pixel and a period for discharging the second output voltage charged in the pixel by using a third input transistor that is turned on/off according to a third input signal and a fourth input transistor that is turned on/off according to a fourth input signal, the fourth input transistor being the same type as the third input transistor.

Yet another embodiment of the present invention provides an amplifying circuit of a liquid crystal display (LCD) including a plurality of pixels, including: an input unit including a first input transistor that is turned on/off according to a first input signal and a second input transistor that is turned on/off according to a second input signal, and being controllable by the first and second input signals; the first transistor including a bias unit receiving a bias voltage for operating the input unit, and being controllable by the input unit; and an output unit including a first output transistor being turned on/off according to a signal of a first node provided at a gate electrode of the first transistor and a second output transistor being turned on/off according to a signal of a second node provided at a first terminal of the first transistor, the first output transistor being the same type as the second output transistor.

BEST MODE

Figure 1:
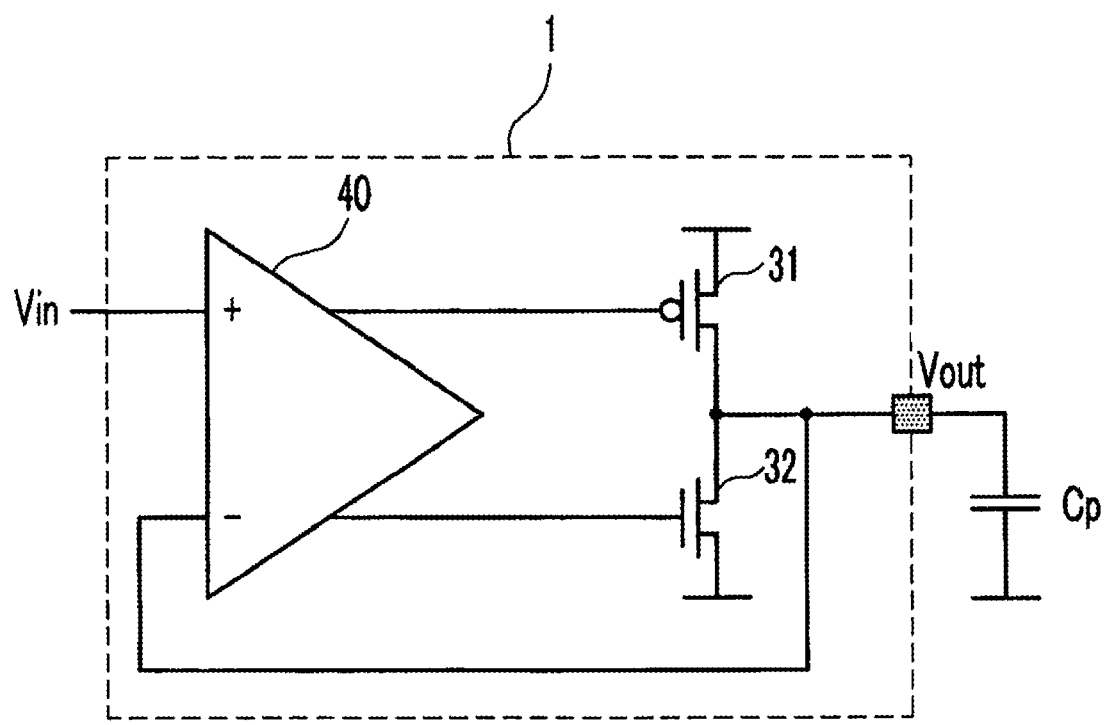
FIG. 1 shows a brief conventional amplifying circuit.
Figure 2:
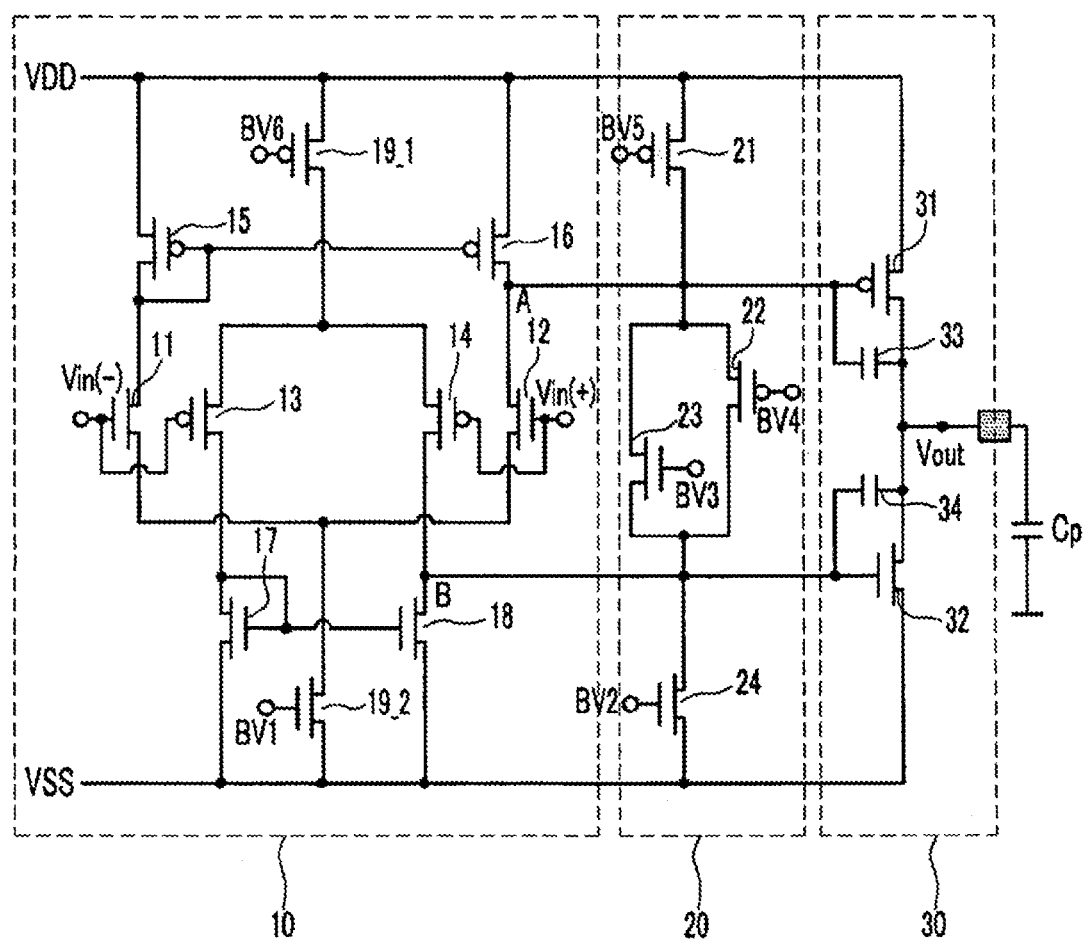
FIG. 2 shows a detailed conventional amplifying circuit.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Figure 3:
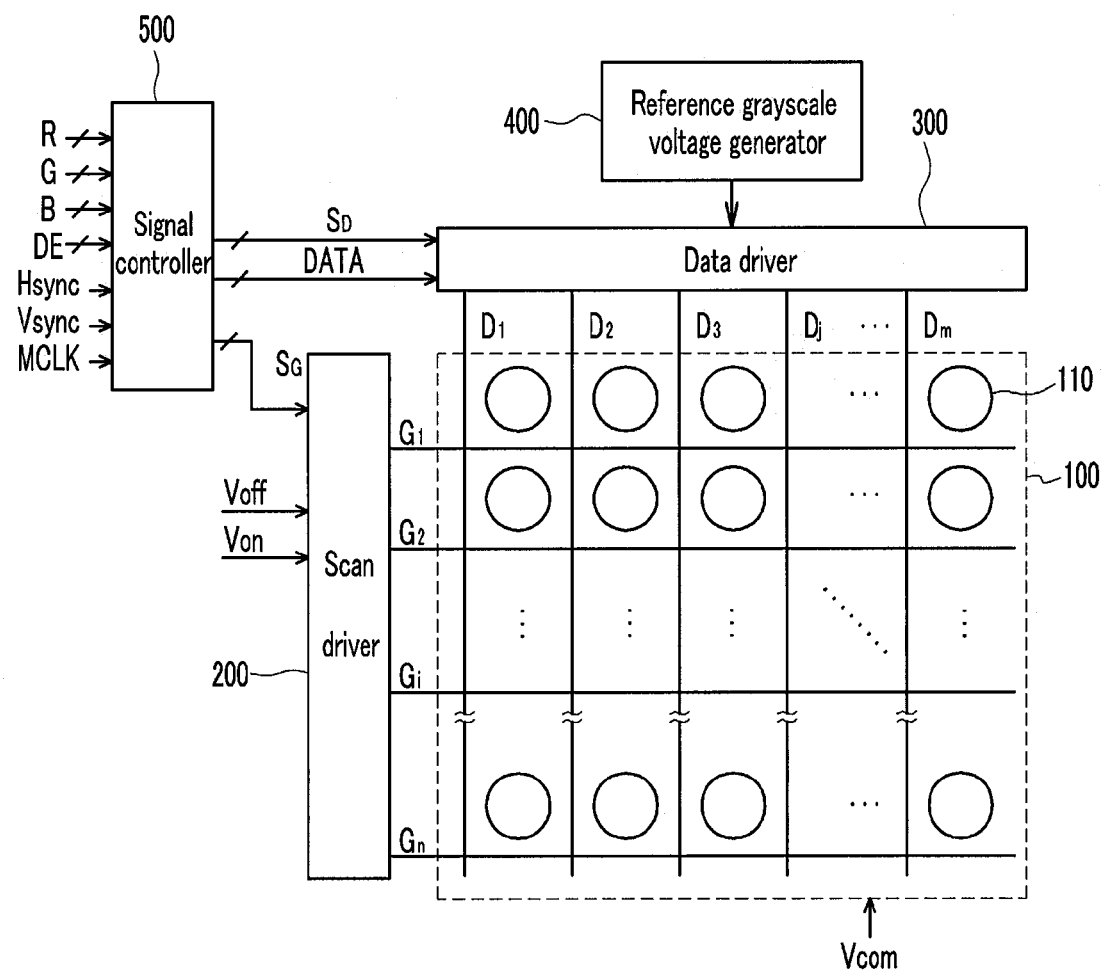
FIG. 3 shows a liquid crystal display (LCD) according to an exemplary embodiment of the present invention.

FIG. 3 shows a liquid crystal display (LCD) according to an exemplary embodiment of the present invention.

As shown in FIG. 3, the liquid crystal display (LCD) includes a liquid crystal display panel 100, a scan driver 200, a data driver 300, a reference grayscale voltage generator 400, and a signal controller 500.

A plurality of scan lines ($G_1$-$G_n$) for transmitting scan signals applied by the scan driver 200 are formed on the liquid crystal display panel 100, and data lines D1-Dm for transmitting data voltages (also called data signals) corresponding to grayscale data are formed thereon to be insulated from the plurality of scan lines and cross the same. A plurality of pixels 110 arranged in a matrix format are surrounded by the scan lines and the data lines, and change the transmittance of light scanned from a back light (not shown) according to signals that are input through the scan lines and the data lines, which will now be described with reference to FIG. 4.

Figure 4:
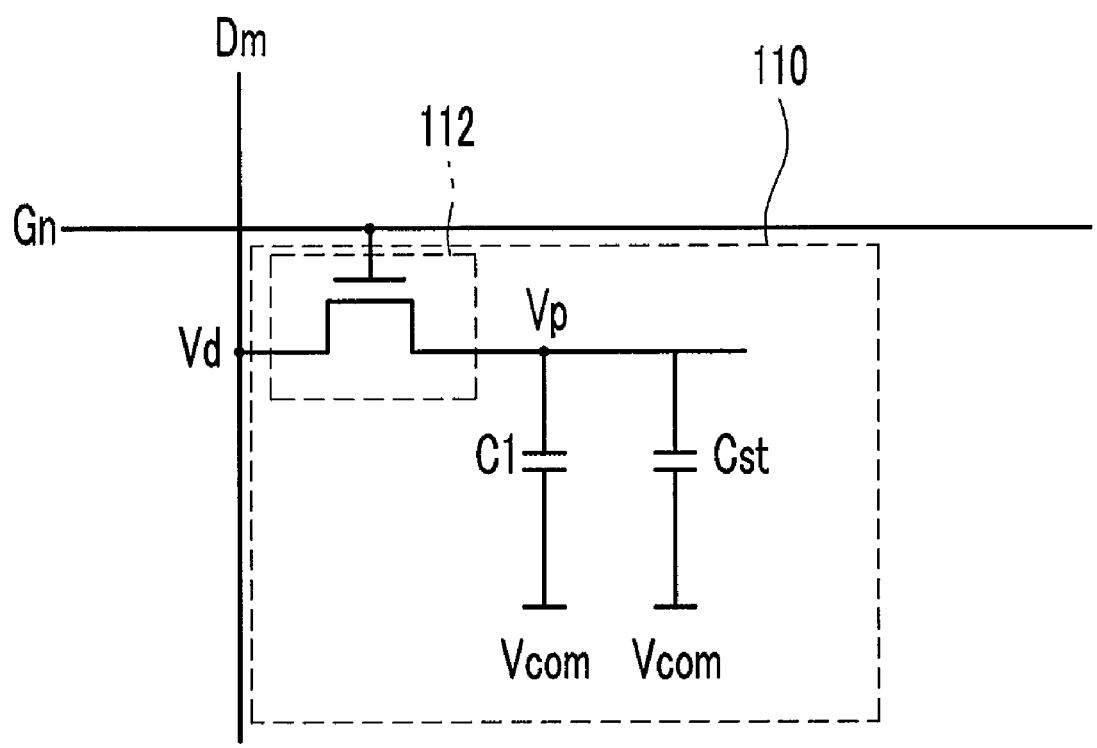
FIG. 4 shows an equivalent circuit of each pixel of a liquid crystal display (LCD) according to an exemplary embodiment of the present invention.

FIG. 4 shows an equivalent circuit of each pixel of a liquid crystal display (LCD) according to an exemplary embodiment of the present invention.

As shown in FIG. 4, each pixel 110 of the liquid crystal display (LCD) includes a TFT 112, a liquid crystal capacitor C1, and a storage capacitor Cst. For reference, the data line Dm represents a random data line from among the data lines D1-Dm, and the scan line Gn represents a random scan line from among the scan lines $G_1$-$G_n$.

The TFT 112 has a source electrode coupled to the data line Dm and a gate electrode coupled to the scan line Gn. The liquid crystal capacitor C1 is coupled between a drain electrode of the TFT 112 and the common voltage (Vcom). A storage capacitor Cst is coupled to a node of the liquid crystal capacitor C1 and a drain electrode of the TFT 112.

Referring to FIG. 4, when a scan signal is applied to the scan line Gn to turn on the TFT 112, a data voltage Vd supplied to the data line Dm is applied to each pixel electrode (not shown) through the TFT 112. An electric field corresponding to a difference between the pixel voltage (Vp) applied to the pixel electrode and the voltage (Vcom) is applied to the liquid crystal (equivalently shown as a liquid crystal capacitor Cl in FIG. 4) so that the light may be transmitted by transmittance that corresponds to the intensity of the electric field. In this instance, the pixel voltage (Vp) must be maintained for one frame or one field, and the storage capacitor Cst is used in the auxiliary manner to maintain the pixel voltage (Vp) applied to the pixel electrode.

Referring to FIG. 3, the scan driver 200 is coupled to the scan lines ($G_1$-$G_n$) of the liquid crystal display panel 100 to apply a scan signal that is generated by combination of a gate-on voltage (Von) and a gate-off voltage (Voff) to the scan lines ($G_1$-$G_n$). In detail, the scan driver 200 applies the gate-on voltage (Von) to the scan lines ($G_1$-$G_n$) according to the gate control signal ($S_G$) transmitted by the signal controller 500 to turn on the switch coupled to the scan lines ($G_1$-$G_n$). The data voltage applied to the data lines D1-Dm is applied to the corresponding pixel 110 through the turned-on switch.

The data driver 300 is coupled to the data lines D1-Dm of the liquid crystal display panel 100, and generates a plurality of gray voltages based on a reference gray voltage transmitted by the reference grayscale voltage generator 400. In detail, the data driver 300 receives a digital video signal (DATA) from the signal controller 500, selects a gray voltage (i.e., a data voltage) corresponding to the digital video signal (DATA) from among a plurality of gray voltages provided by the reference grayscale voltage generator 400, and applies it to the data lines D1-Dm.

The reference grayscale voltage generator 400 generates two reference gray voltage sets relating to the transmittance of the pixel 110 according to the video data signals (R, G, B) input to the signal controller 500. The first set has a voltage (VDD-Vcom) having a greater level than the common voltage (Vcom), and the second set has a voltage (Vcom-Vss) having a lesser level than the common voltage (Vcom).

The signal controller 500 receives the video data signals (R, G, B) and an input control signal for controlling display of the same from the outside, or from a graphics controller (not shown). The input control signal includes a horizontal synchronization signal (Hsync), a vertical synchronization signal (Vsync), a data applying area signal (DE), and a main clock signal (MCLK). Here, the data applying area signal (DE) indicates a data output area, and the main clock signal (MCLK) is input from a microprocessor (not shown) and is a reference signal.

The signal controller 500 processes the video data signals (R, G, B) according to an operational condition of the liquid crystal display panel 100 to generate a gate control signal ($S_G$), a data control signal ($S_D$), and a digital video signal (DATA). The signal controller 500 transmits the gate control signal ($S_G$) to the scan driver 200, and supplies the data control signal ($S_D$) and the digital video signal (DATA) to the data driver 300 to control the scan driver 200 and the data driver 300.

The gate control signal ($S_G$) according to the exemplary embodiment of the present invention includes a scan start signal (STV) for instructing a scan start, and at least one clock signal for controlling an output period of the gate-on voltage (Von). The data control signal ($S_D$) includes a horizontal sync start signal (STH) for notifying of transmission start on the video signal for one pixel, a load signal (LOAD) for applying a data voltage to the data lines D1-Dm, and a data clock signal (HCLK). Also, the data control signal ($S_D$) further includes an inverting signal (RVS) for inverting the polarity of the data voltage for the common voltage (Vcom). The data control signal ($S_D$) further includes a plurality of signals (SEL0, SEL1, SHL) for controlling the data driver 300.

Figure 5:
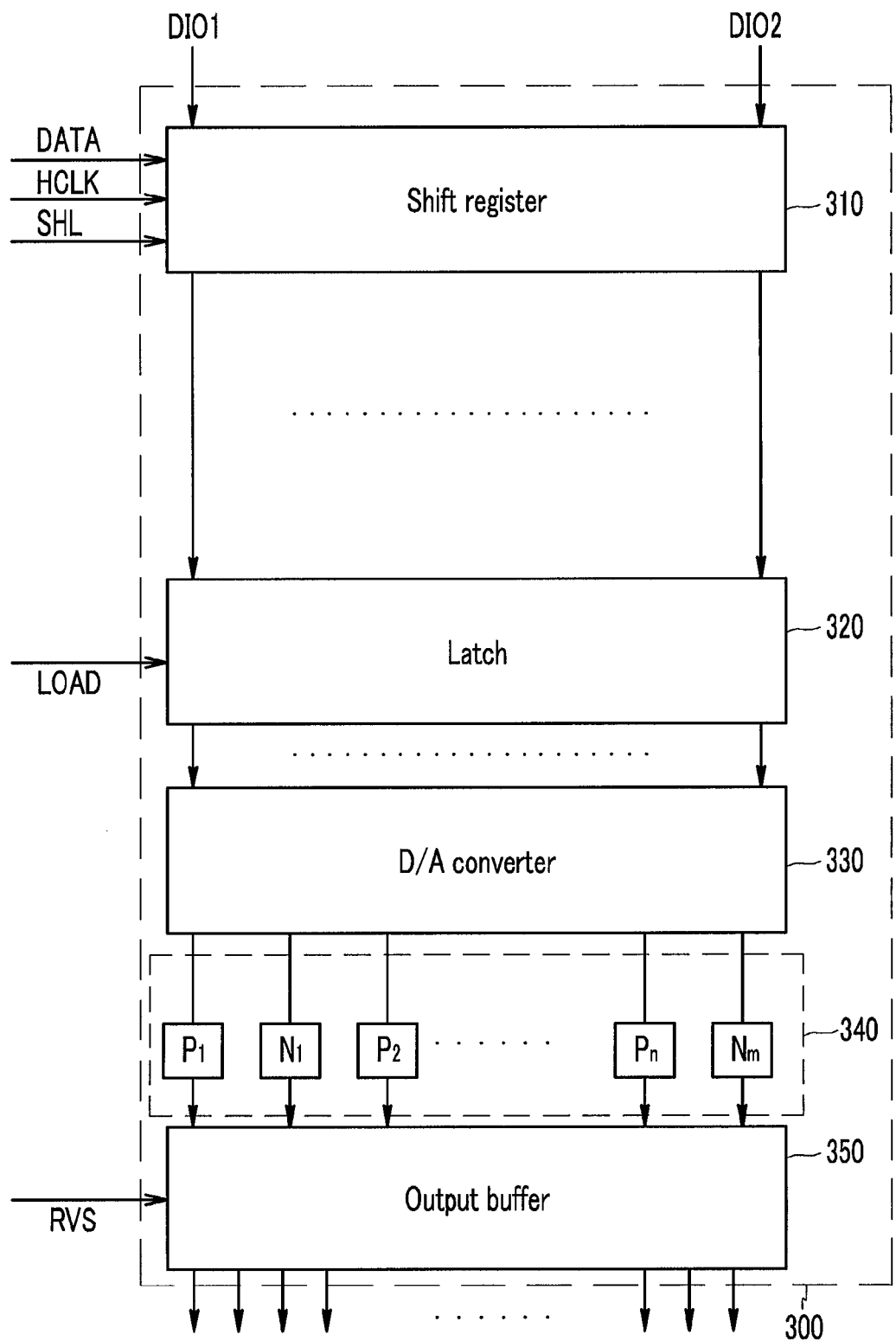
FIG. 5 shows a block diagram of a data driver according to an exemplary embodiment of the present invention.

FIG. 5 shows a block diagram of a data driver according to an exemplary embodiment of the present invention.

As shown in FIG. 5, the data driver 300 includes a shift register 310, a latch 320, a digital to analog (D/A) converter 330, an output voltage amplifier 340, and an output buffer 350.

The shift register 310 shifts the position of the output terminal for outputting an enable signal in synchronization with the data clock signal (HCLK) provided by the signal controller 500. The area of the selected latch 320 is sequentially shifted so that all the areas of the latch 320 sequentially store the digital video signal (DATA) transmitted by the shift register 310.

The latch 320 is coupled to the shift register 310, and stores the digital video signal (DATA) according to the enable signal transmitted by the shift register 310. In this instance, when the digital video signal (DATA) corresponding to one row is stored in the latch 320, the signal controller 500 changes the level of the load signal (LOAD) applied to the latch 320, and hence, the digital video signal (DATA) stored in the area of the latch 320 is transmitted to the digital to analog (D/A) converter 330.

The digital to analog (D/A) converter 330 selects a gray voltage that corresponds to the digital video signal (DATA) from among a plurality of analog gray voltages provided by the reference grayscale voltage generator 400, and transmits it to the output voltage amplifier 340.

The output voltage amplifier 340 includes a plurality of positive amplifying circuits ($P_1$-Pn) and negative amplifying circuits ($N_1$-Nm). Each positive amplifying circuit applies a gray voltage that is greater than the common voltage (Vcom) by a predetermined level from among a plurality of gray voltages that are generated based on a plurality of reference gray voltages to the capacitor (Cp) of the pixel, and each negative amplifying circuit applies a gray voltage that is less than the common voltage (Vcom) by a predetermined level from among a plurality of gray voltages to the capacitor (Cp). The plurality of positive and negative amplifying circuits ($P_1$-Pn, $N_1$-Nm) receive a data voltage from the D/A converter 330 through a non-inverting terminal (+) (not shown) coupled to the D/A converter 330. In this instance, the positive and negative amplifying circuits ($P_1$-Pn, $N_1$-Nm) function as voltage followers. The output buffer 350 outputs the voltage provided by the output voltage amplifier 340.

An amplifying circuit according to a first exemplary embodiment of the present invention will now be described.

Figure 6:
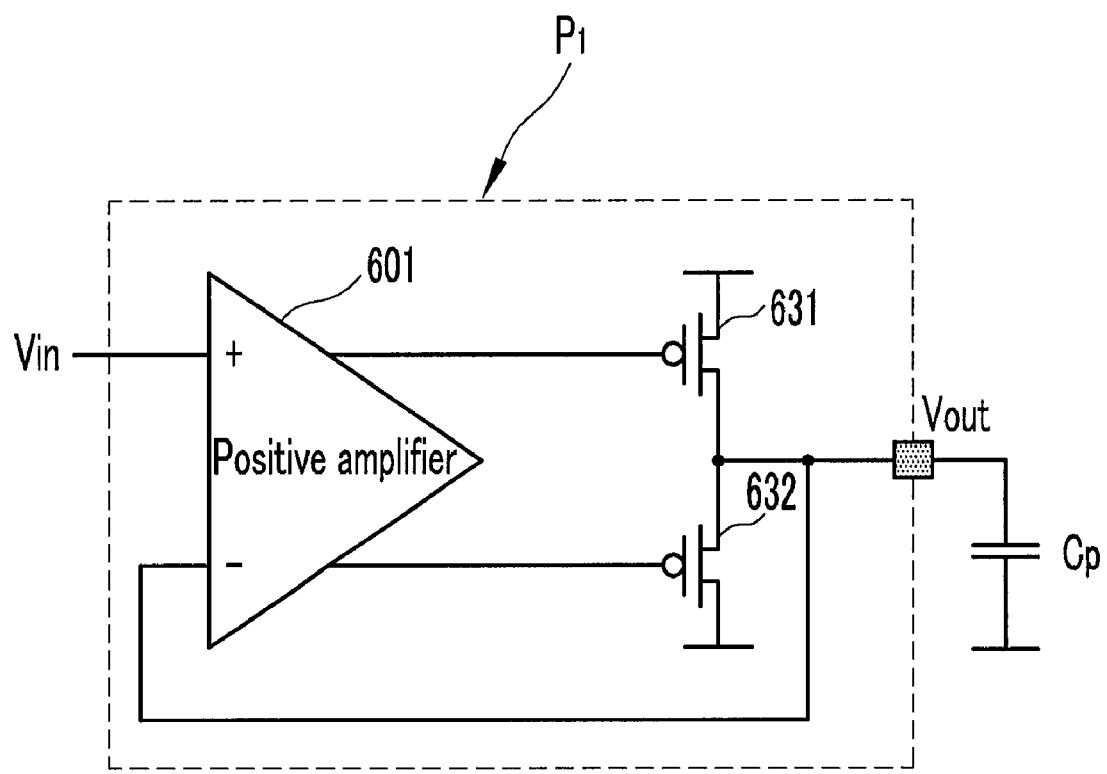
FIG. 6 shows a brief positive amplifying circuit according to a first exemplary embodiment of the present invention.
Figure 7:
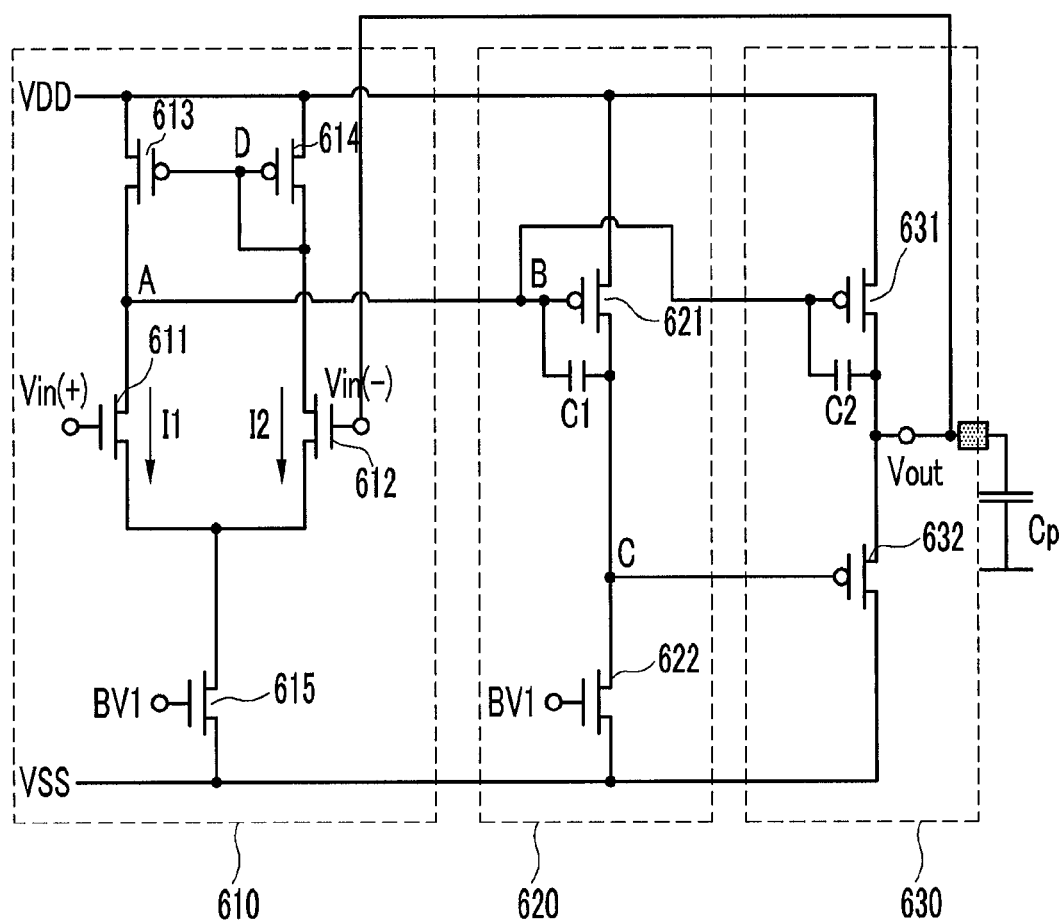
FIG. 7 shows a detailed positive amplifying circuit shown in FIG. 6.

FIG. 6 shows a brief positive amplifying circuit according to a first exemplary embodiment of the present invention, and FIG. 7 shows a detailed positive amplifying circuit shown in FIG. 6. For better understanding and ease of description in the first exemplary embodiment of the present invention, a positive amplifying circuit $P_1$ will be used from among the plurality of positive amplifying circuits ($P_1$-Pn) to describe the positive amplifying circuit in detail.

As shown in FIG. 6, the positive amplifying circuit $P_1$ generates an output voltage by using a positive amplifier 601 and the same type of transistors 631 and 632. The positive amplifying circuit $P_1$ transmits the generated output voltage to the pixel capacitor (Cp), and receives the same voltage as the voltage transmitted to the pixel capacitor (Cp) through the inverting input terminal (−) of the positive amplifying circuit $P_1$. In this instance, when the input voltage is applied to the non-inverting input terminal (+) of the positive amplifying circuit $P_1$, the voltage of the pixel capacitor (Cp) is charged or discharged according to the input voltage applied to the non-inverting input terminal (+) and the previous output voltage input to the inverting input terminal (−). That is, when a voltage that is greater than the voltage applied to the inverting input terminal (−) by a predetermined level is applied to the non-inverting input terminal (+), the positive amplifying circuit $P_1$ charges the pixel capacitor (Cp) with the voltage (hereinafter called the first output voltage) that is greater than the common voltage (Vcom) by a predetermined level according to the voltage applied to the non-inverting input terminal (+) and the inverting input terminal (−). In this instance, when a voltage that is less than the voltage applied to the inverting input terminal (−) by a predetermined level is applied to the non-inverting input terminal (+), the positive amplifying circuit $P_1$ discharges the first output voltage charged in the pixel capacitor (Cp) according to the voltage applied to the non-inverting input terminal (+) and the inverting input terminal (−).

As shown in FIG. 7, the positive amplifying circuit $P_1$ includes an input unit 610, a bias unit 620, and an output unit 630. In this instance, the input unit 610 and the bias unit 620 of FIG. 7 configure the positive amplifier 601 of FIG. 6. Referring to FIG. 7, the transistors 611, 612, 615, and 622 are N-channel field effect transistors, and the transistors 613, 614, 621, 631, and 632 are P-channel field effect transistors.

The input unit 610 includes the transistors 611, 612, 613, 614, and 615, and a bias voltage BV1 is applied to the transistor 615. A gate electrode of the transistor 611 is coupled to the non-inverting input terminal (+), and a gate electrode of the transistor 612 is coupled to the inverting input terminal (−). A drain of the transistor 611 is coupled to a drain of the transistor 613, and a drain of the transistor 612 is coupled to a drain of the transistor 614. A gate electrode of the transistor 613 is coupled to a gate electrode of the transistor 614, and sources of the transistors 613 and 614 are coupled to the power source voltage VDD. A drain of the transistor 615 is coupled to sources of the transistors 611 and 612, and a source of the transistor 615 is coupled to the ground voltage (VSS).

The bias unit 620 includes transistors 621 and 622 and a capacitor C1, and the bias voltage BV1 is applied to the transistor 622. In this instance, a gate electrode of the transistor 621 is coupled to a node A, and a capacitor C1 is coupled between a gate and a drain of the transistor 621. A drain of the transistor 622 is coupled to a drain of the transistor 621, and a source of the transistor 622 is coupled to the ground voltage (VSS).

The output unit 630 includes transistors 631 and 632, and a capacitor C2. A gate electrode of the transistor 631 is coupled to a node B, and a capacitor C2 is coupled between a gate and a drain of the transistor 631. A gate electrode of the transistor 632 is coupled to a node C, and a source of the transistor 632 is coupled to a drain of the transistor 631. In this instance, the pixel capacitor (Cp) of the liquid crystal display panel 100 is coupled between the transistors 631 and 632.

Figure 8:
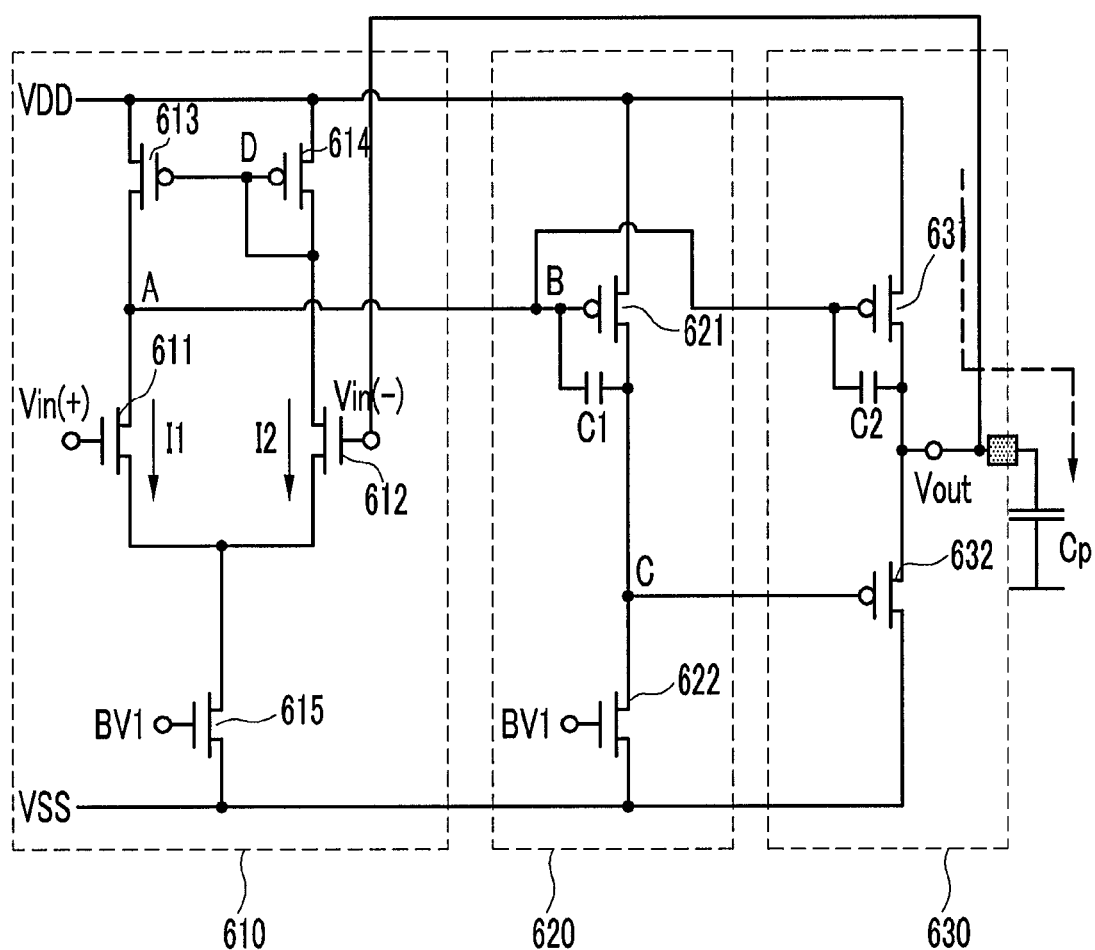
FIG. 8 and FIG. 9 show an operation of a positive amplifying circuit according to a first exemplary embodiment of the present invention.
Figure 9:
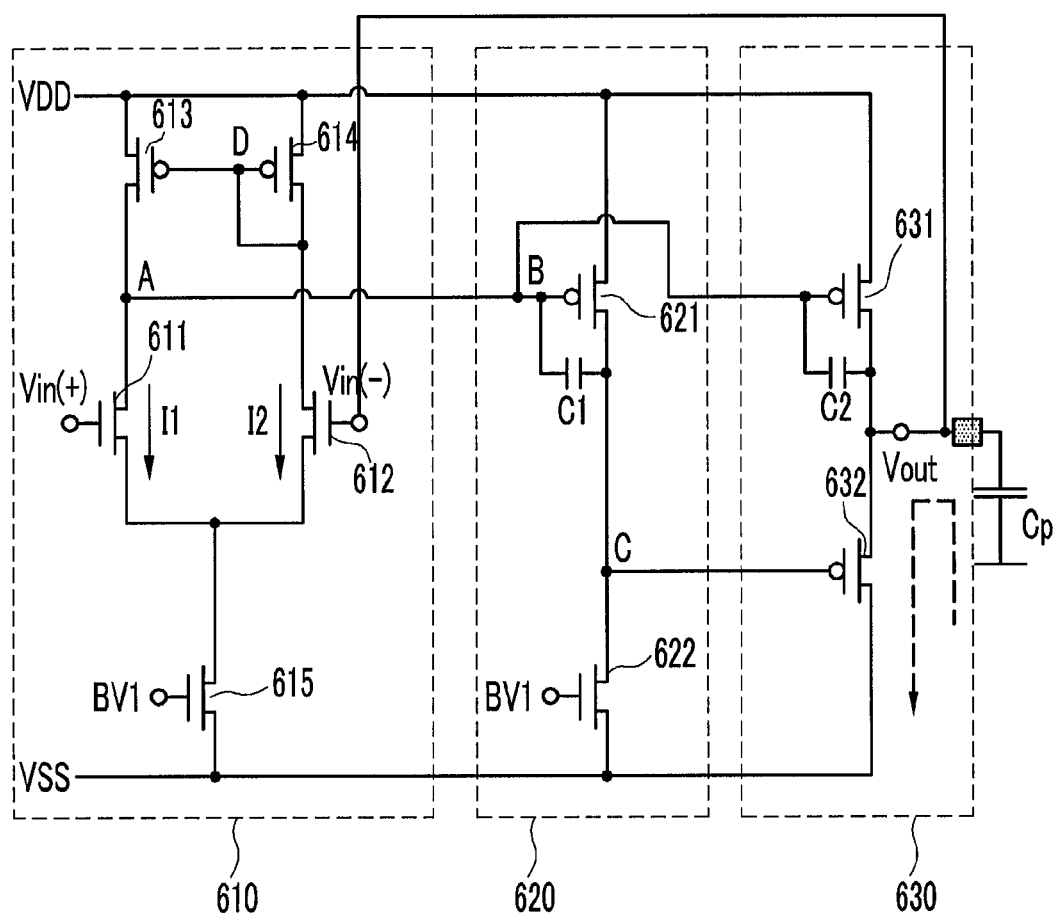

FIG. 8 and FIG. 9 show an operation of a positive amplifying circuit according to a first exemplary embodiment of the present invention.

FIG. 8 shows a process for a positive amplifying circuit $P_1$ according to the first exemplary embodiment of the present invention to apply a first output voltage to the pixel capacitor (Cp) and charge the pixel capacitor (Cp), and FIG. 9 shows a process for a positive amplifying circuit $P_1$ according to the first exemplary embodiment of the present invention to discharge the first output voltage charged in the pixel capacitor (Cp).

Referring to FIG. 8 and FIG. 9, the input unit 610 is operable in response to the bias voltage BV1. That is, the bias voltage BV1 is applied to the transistors 615 and 622, and the transistors 615 and 622 are turned on to operate the input unit 610.

As shown in FIG. 8, when the voltage level that is input to the gate electrode of the transistor 611 is greater than the voltage level that is input to the gate electrode of the transistor 612 in the input unit 610, the transistor 611 provides the greater current I1 to the ground voltage (VSS) than the transistor 612 so that the voltage levels of the nodes A and B are less than the voltage level of the node D. In this instance, as the voltage level of the node B is reduced, the transistor 621 is turned on to gradually increase the voltage level of the node C and thereby turn off the transistor 632. As the voltage level of the node B is reduced, the transistor 631 is turned on to charge the pixel capacitor (Cp) with the first output voltage.

As shown in FIG. 9, when the voltage level input to the gate electrode of the transistor 611 is less than the voltage level input to the gate electrode of the transistor 612 in the input unit 610, the transistor 612 transmits the greater current I2 to the ground voltage (VSS) than the transistor 611 so that the voltage levels of the nodes A and B are greater than the voltage level of the node D. The transistor 631 is turned off according to the increased voltage level of the node B. As the voltage level of the node B is increased, the transistor 621 is turned off and the voltage level of the node C is reduced to be less than that of the node B. The transistor 632 is turned on according to the reduced voltage level of the node C to discharge the first output voltage charged in the pixel capacitor (Cp).

Figure 10:
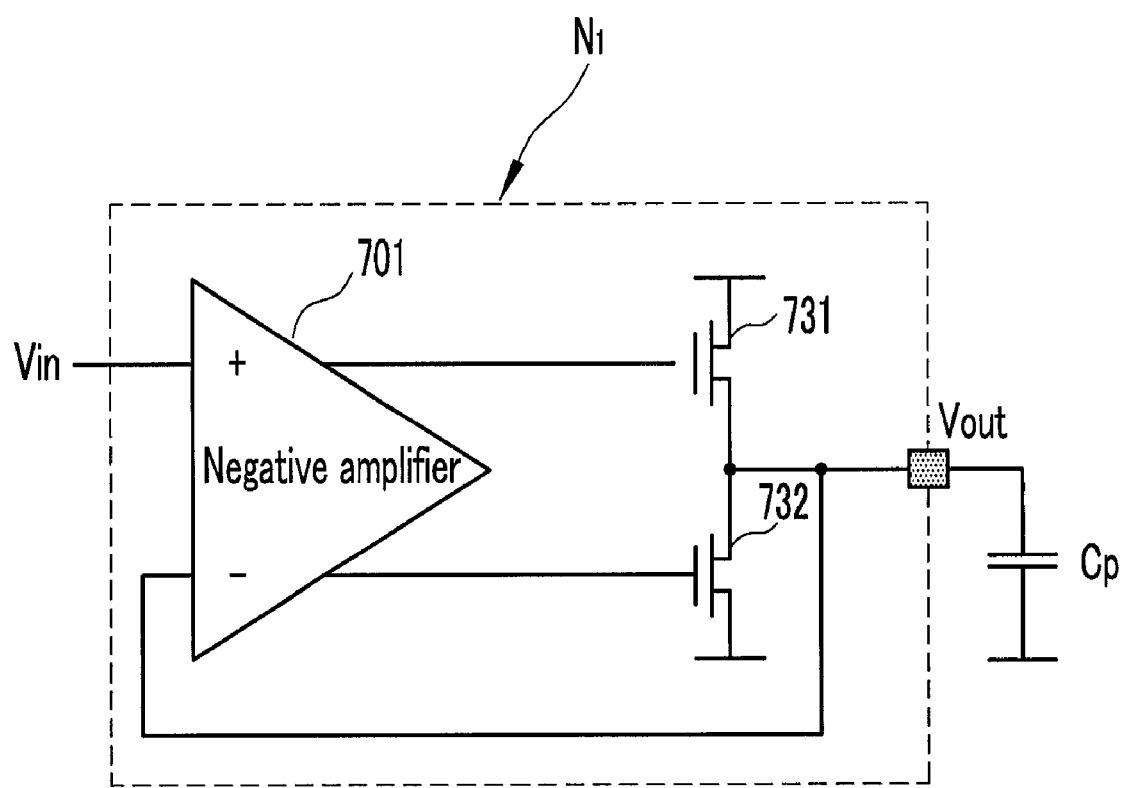
FIG. 10 shows a brief negative amplifying circuit according to a first exemplary embodiment of the present invention.
Figure 11:
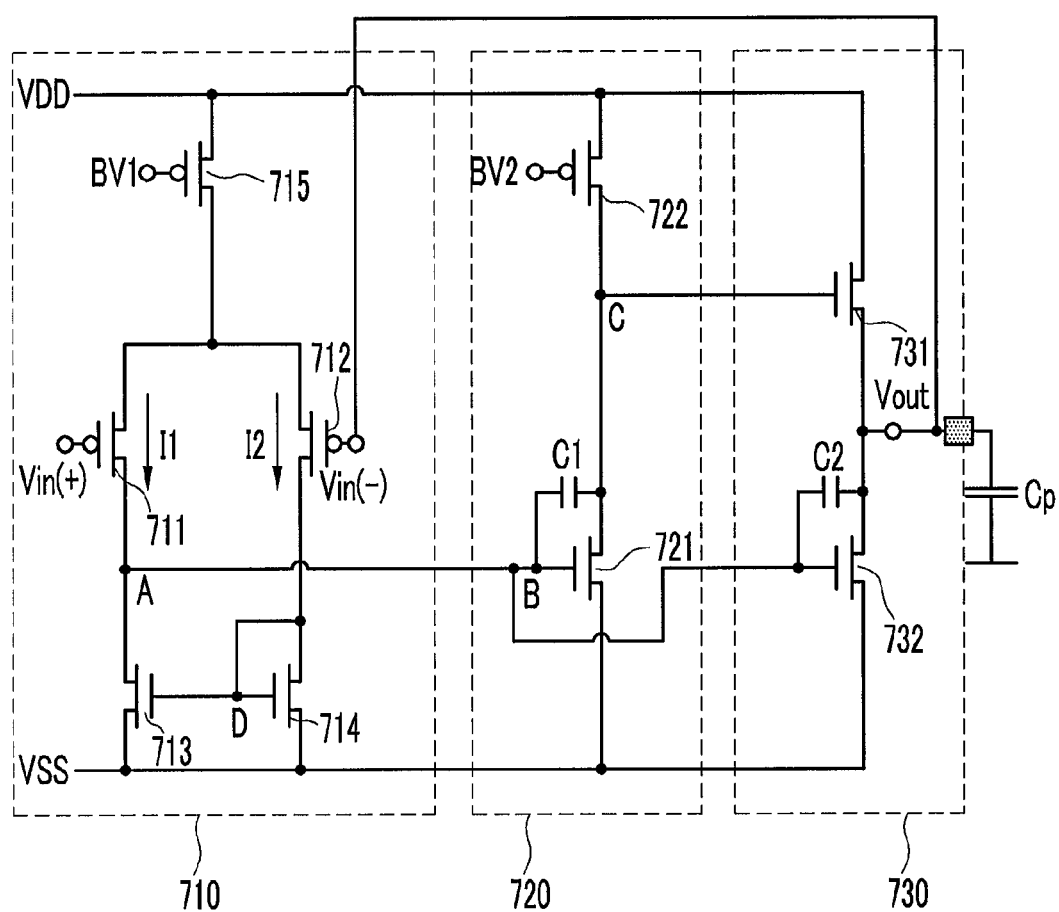
FIG. 11 shows a detailed negative amplifying circuit shown in FIG. 10.

FIG. 10 shows a brief negative amplifying circuit according to a first exemplary embodiment of the present invention, and FIG. 11 shows a detailed negative amplifying circuit shown in FIG. 10. For better understanding and ease of description in the first exemplary embodiment of the present invention, the negative amplifying circuit will be described in detail with reference to the negative amplifying circuit $N_1$ from among a plurality of negative amplifying circuits ($N_1$-Nm).

As shown in FIG. 10, the negative amplifying circuit $N_1$ according to the first exemplary embodiment of the present invention generates an output voltage by using a negative amplifier 701 and the same type of transistors 731 and 732. The negative amplifying circuit $N_1$ transmits the generated output voltage to the pixel capacitor (Cp), and receives the same voltage as the voltage transmitted to the pixel capacitor (Cp) through the inverting input terminal (−) of the negative amplifying circuit $N_1$. In this instance, when the input voltage is applied to the non-inverting input terminal (+) of the negative amplifying circuit $N_1$, the pixel capacitor (Cp) is charged or discharged according to the input voltage that is applied to the non-inverting input terminal (+) and the previous output voltage that is input to the inverting input terminal (−). That is, when a voltage that is greater than the voltage applied to the inverting input terminal (−) by a predetermined level is applied to the non-inverting input terminal (+), the negative amplifying circuit $N_1$ charges the voltage (hereinafter called the second output voltage) that is less than the common voltage (Vcom) by a predetermined level into the pixel capacitor (Cp) according to the voltages applied to the non-inverting input terminal (+) and the inverting input terminal (−). In this instance, when a voltage that is less than the voltage applied to the inverting input terminal (−) by a predetermined level is applied to the non-inverting input terminal (+), the negative amplifying circuit $N_1$ discharges the second output voltage charged in the pixel capacitor (Cp) according to the voltages applied to the non-inverting input terminal (+) and the inverting input terminal (−).

Figure 12:
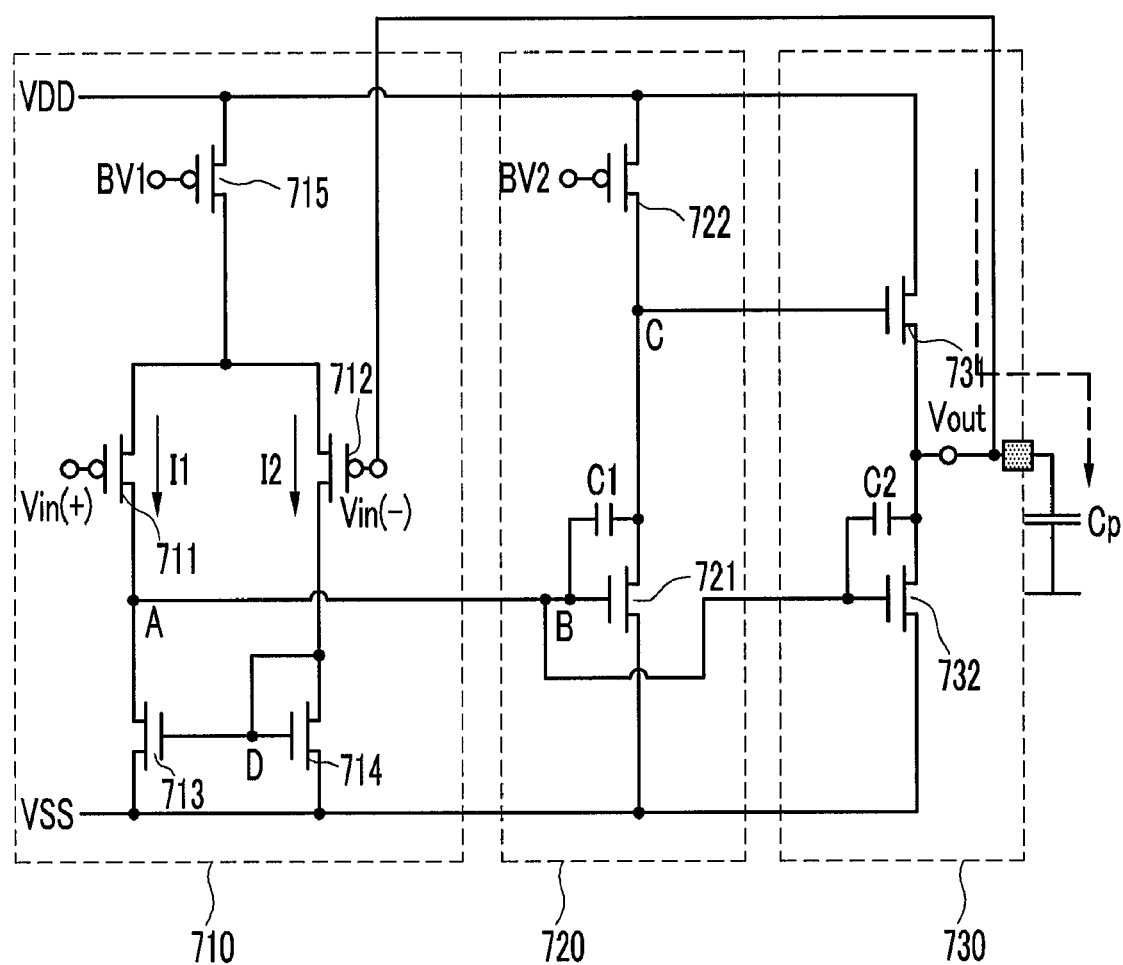
FIG. 12 and FIG. 13 show an operation of a negative amplifying circuit according to a first exemplary embodiment of the present invention.
Figure 13:
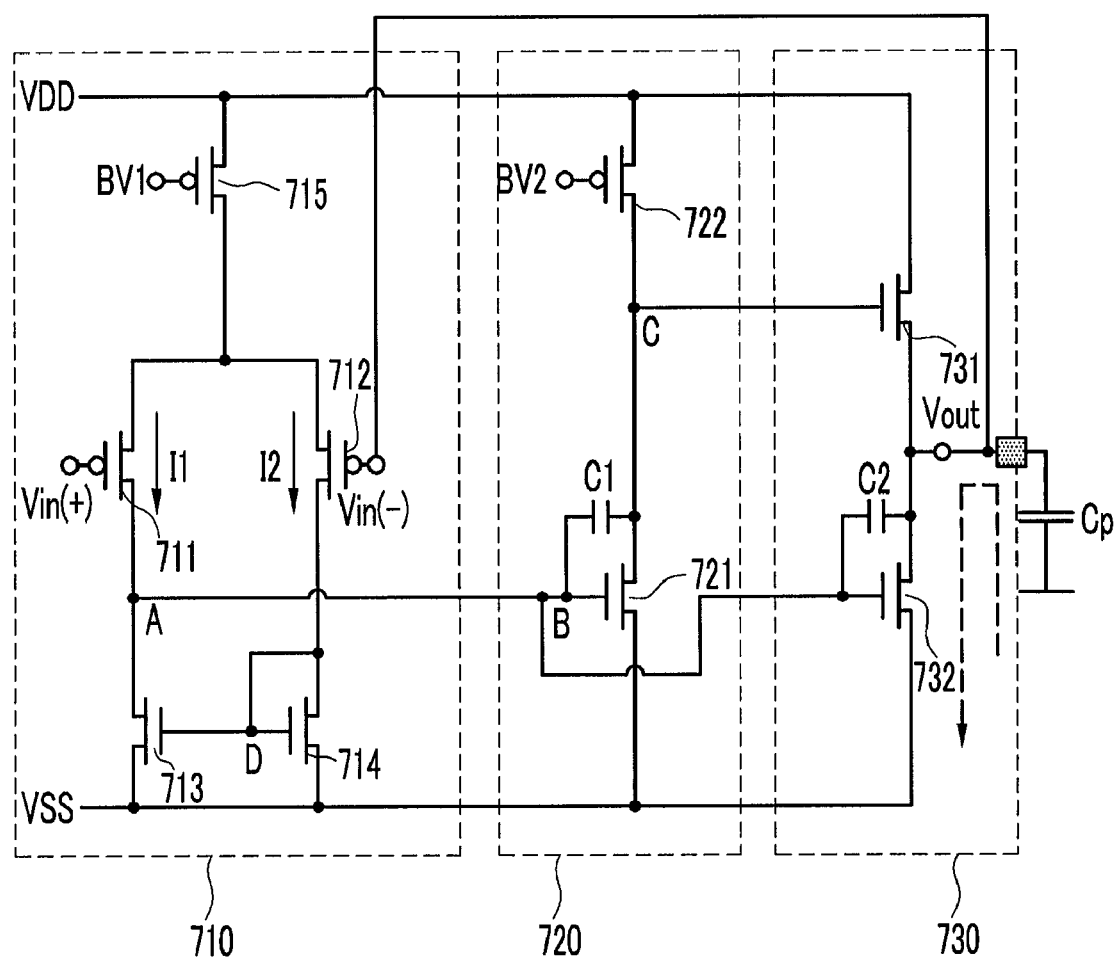

As shown in FIG. 11, constituent elements of the negative amplifying circuit $N_1$ according to the first exemplary embodiment of the present invention use the constituent elements of the positive amplifying circuit $P_1$, different types of transistors, and corresponding constituent elements, and the negative amplifying circuit shown in FIG. 11 will not be described. The connection states of the negative amplifying circuit $N_1$ are different from those of the positive amplifying circuit $P_1$, and since the differences are caused by changing the constituent elements and their positions according to the differences of the transistor types, no detailed description of the circuit operation of the negative amplifying circuit shown in FIG. 12 and FIG. 13 will be provided.

The positive and negative amplifying circuits according to the first exemplary embodiment of the present invention do not adopt the rail to rail structure, but use a single input transistor to reduce the area occupied by the input transistor compared to that of the conventional amplifying circuit and reduce the entire size of the amplifying circuit. Further, the positive and negative amplifying circuits according to the first exemplary embodiment of the present invention reduce the entire power consumption as the number of applied constant current sources is reduced compared to that of the conventional amplifying circuit.

However, when the positive and negative amplifying circuits according to the first exemplary embodiment of the present invention charge or discharge the pixel capacitor (Cp) with a voltage, the same type of output transistor is used so that the time for charging the output voltage into the pixel capacitor (Cp) and the time for discharging the output voltage are asymmetrically maintained, and the video displayed on the liquid crystal display panel 100 may generate a problem. That is, regarding the transistors 631 and 632 of the positive amplifying circuit, the transistor 631 functions as a driver and the transistor 632 functions as a switch, and regarding the transistors 731 and 732 of the negative amplifying circuit, the transistor 732 functions as a driver and the transistor 731 functions as a switch, and hence a problem may occur because of the asymmetric phenomenon.

An amplifying circuit according to a second exemplary embodiment of the present invention in order to solve the problem will now be described.

Figure 14:
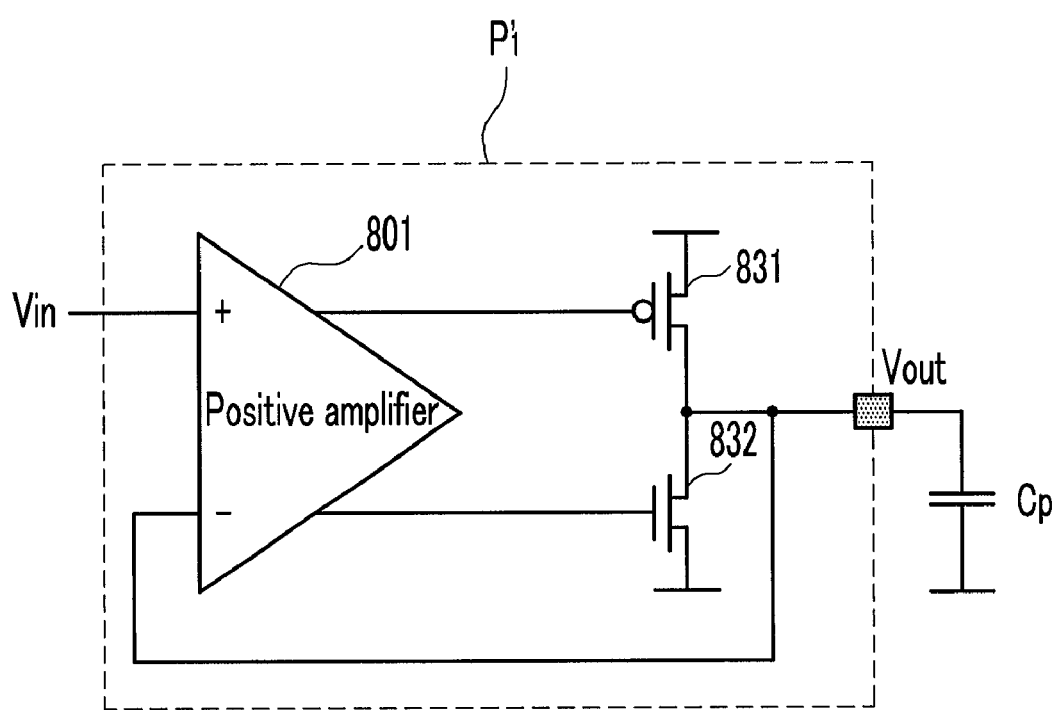
FIG. 14 shows a brief positive amplifying circuit according to a second exemplary embodiment of the present invention.
Figure 15:
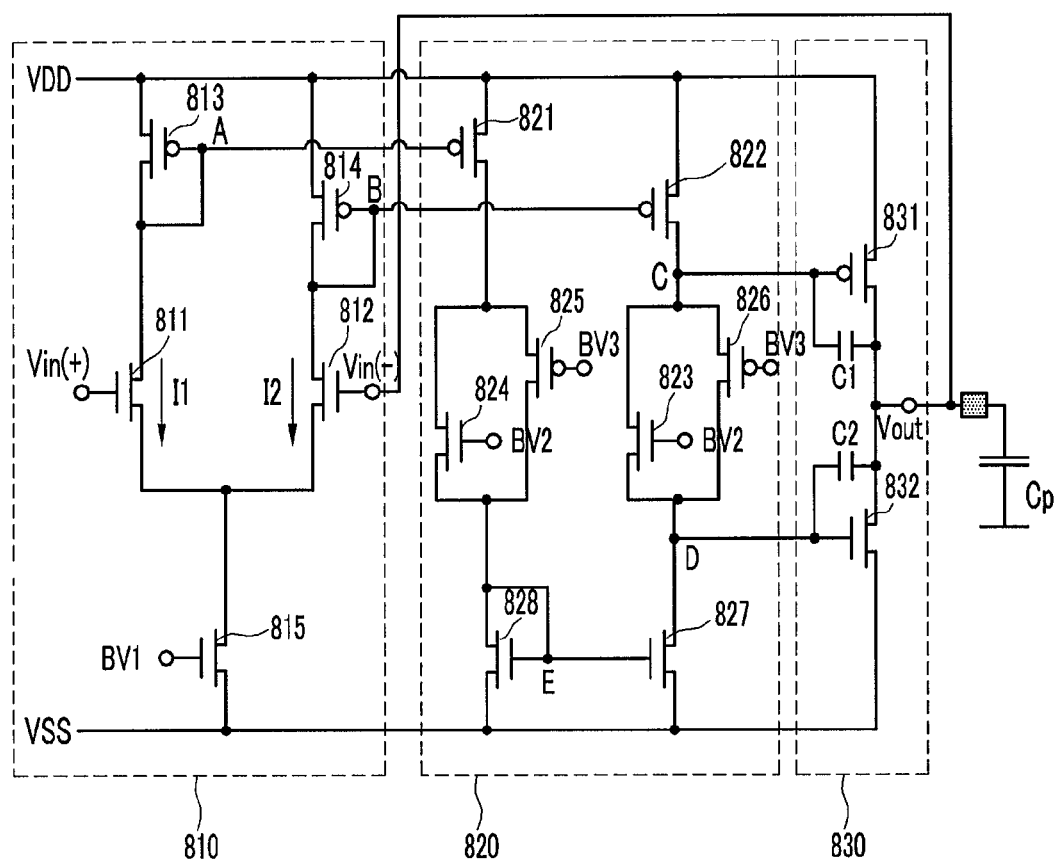
FIG. 15 shows a detailed positive amplifying circuit shown in FIG. 14.

FIG. 14 shows a brief positive amplifying circuit according to a second exemplary embodiment of the present invention, and FIG. 15 shows a detailed positive amplifying circuit shown in FIG. 14.

As shown in FIG. 14, the positive amplifying circuit ($P_1'$) according to the second exemplary embodiment of the present invention generates an output voltage by using a positive amplifier 801 and different types of transistors 831 and 832. The positive amplifying circuit ($P_1'$) transmits the generated output voltage to the pixel capacitor (Cp), and receives the same voltage as that transmitted to the pixel capacitor (Cp) through the inverting input terminal (−) of the positive amplifying circuit ($P_1'$). In this instance, when an input voltage is applied to the non-inverting input terminal (+) of the positive amplifying circuit ($P_1'$), the pixel capacitor (Cp) is charged or discharged with a voltage according to the input voltage applied to the non-inverting input terminal (+) and the previous output voltage input to the inverting input terminal (−). That is, when a voltage that is greater than the voltage applied to the inverting input terminal (−) by a predetermined level is applied to the non-inverting input terminal (+), the positive amplifying circuit ($P_1'$) charges the pixel capacitor (Cp) with a voltage (hereinafter called the first output voltage) that is greater than the common voltage (Vcom) by a predetermined level according to the voltages applied to the non-inverting input terminal (+) and the inverting input terminal (−). In this instance, when a voltage that is less than the voltage applied to the inverting input terminal (−) by a predetermined level is applied to the non-inverting input terminal (+), the positive amplifying circuit ($P_1'$) discharges the first output voltage charged in the pixel capacitor (Cp) according to the voltages applied to the non-inverting input terminal (+) and the inverting input terminal (−).

As shown in FIG. 15, the positive amplifying circuit ($P_1'$) according to the second exemplary embodiment of the present invention includes an input unit 810, a bias unit 820, and an output unit 830. In this instance, the input unit 810 and the bias unit 820 of FIG. 15 configure the positive amplifier 801 of FIG. 14. Referring to FIG. 15, transistors 811, 812, 815, 823, 824, 827, 828, and 832 are N-channel field effect transistors, and transistors 813, 814, 821, 822, 825, 826, and 831 are P-channel field effect transistors.

The input unit 810 includes the transistors 811, 812, 813, 814, and 815, and the bias voltage BV1 is applied to the transistor 815. A gate electrode of the transistor 811 is coupled to the non-inverting input terminal (+), and a gate electrode of the transistor 812 is coupled to the inverting input terminal (−). A drain of the transistor 811 is coupled to a drain of the transistor 813, a drain of the transistor 812 is coupled to a drain of the transistor 814, and sources of the transistors 813 and 814 are coupled to the power source voltage VDD. A drain of the transistor 815 is coupled to sources of the transistors 811 and 812, and a source of the transistor 815 is coupled to the ground voltage (VSS).

The bias unit 820 includes transistors 821, 822, 823, 824, 825, 826, 827, and 828, and bias voltages BV2 and BV3 are respectively applied to the transistors 823, 824, 825, and 826. A gate electrode of the transistor 821 is coupled to a gate electrode of the transistor 813, a gate electrode of the transistor 822 is coupled to a gate electrode of the transistor 814, and sources of the transistors 821 and 822 are coupled to the power source voltage VDD. A drain of the transistor 824 and a source of the transistor 825 are coupled to a drain of the transistor 821, and a source of the transistor 824 and a drain of the transistor 825 are coupled to a drain of the transistor 828. A drain of the transistor 823 and a source of the transistor 826 are coupled to a drain of the transistor 822, and a source of the transistor 823 and a drain of the transistor 826 are coupled to a drain of the transistor 827. Gate electrodes of the transistors 827 and 828 are coupled with each other, and sources of the transistors 827 and 828 are coupled to the ground voltage (VSS).

The output unit 830 includes transistors 831 and 832 and capacitors C1 and C2. A gate electrode of the transistor 831 is coupled to a node C, and a capacitor C1 is coupled between a gate and a drain of the transistor 831. A gate electrode of the transistor 832 is coupled to a node D, and a capacitor C2 is coupled between a gate and a drain of the transistor 832. In this instance, the pixel capacitor (Cp) of the liquid crystal display panel 100 is coupled between the transistors 831 and 832.

Figure 16:
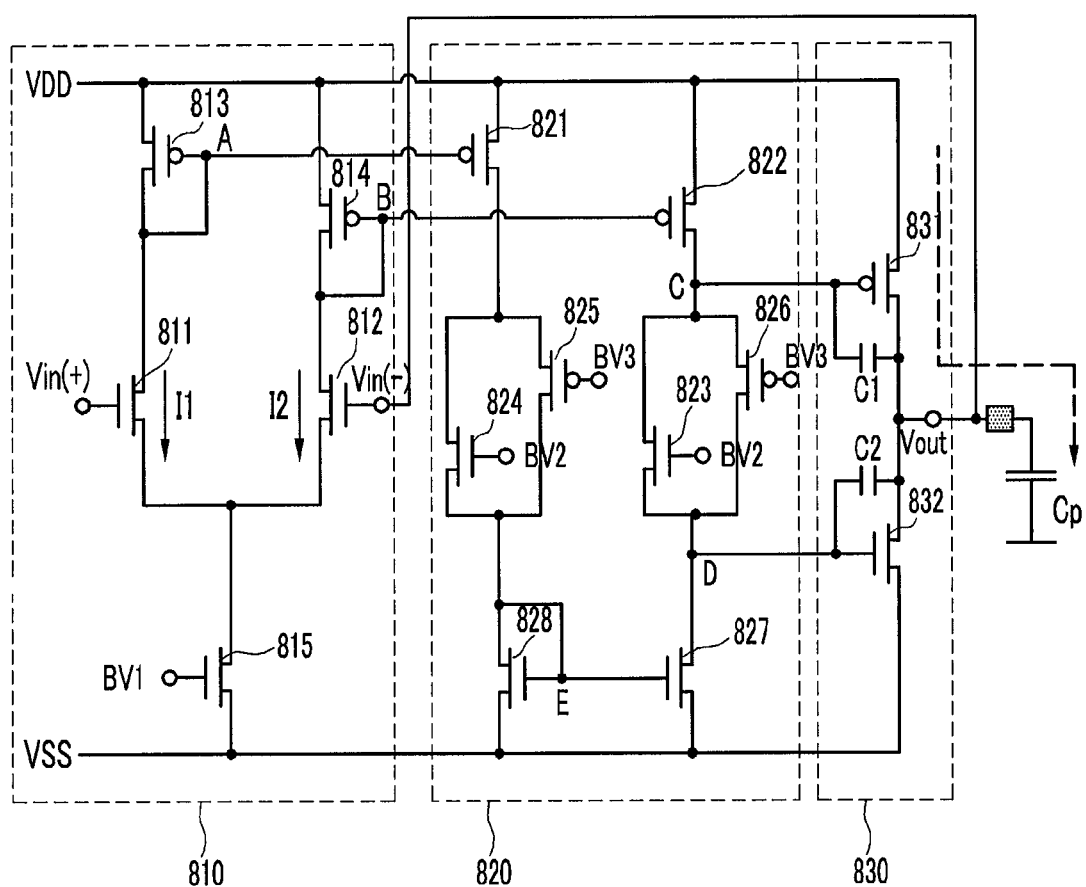
FIG. 16 and FIG. 17 show an operation of a positive amplifying circuit according to a second exemplary embodiment of the present invention.
Figure 17:
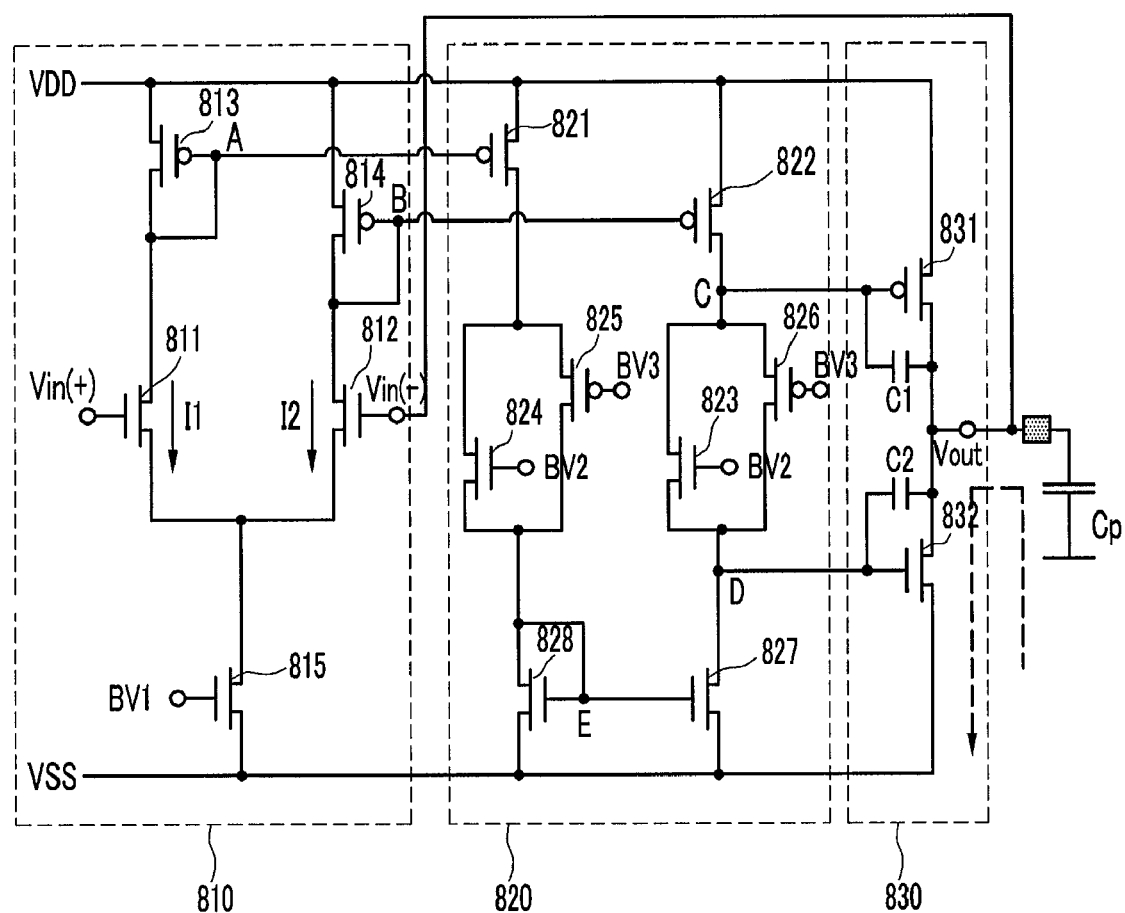

FIG. 16 and FIG. 17 show an operation of a positive amplifying circuit according to a second exemplary embodiment of the present invention.

FIG. 16 shows a process for a positive amplifying circuit 800 according to a second exemplary embodiment of the present invention to apply a first output voltage to a pixel capacitor (Cp) and charge the same, and FIG. 17 shows a process for the positive amplifying circuit 800 according to the second exemplary embodiment of the present invention to discharge the first output voltage charged in the pixel capacitor (Cp).

Referring to FIG. 16 and FIG. 17, the input unit 810 is operable in response to the bias voltages BV1, BV2, and BV3. That is, when the bias voltages BV1, BV2, and BV3 are applied to the transistors 815, 823, 824, 825, and 826, the transistors 815, 823, 824, 825, and 826 are turned on to operate the input unit 810.

As shown in FIG. 16, when the voltage level that is input to the gate electrode of the transistor 811 is greater than the voltage level that is input to the gate electrode of the transistor 812 in the input unit 810, the transistor 811 transmits the greater current I1 to the ground voltage (VSS) than the transistor 812 so that the voltage level at the node A becomes less than the voltage level at the node B. In this instance, as the voltage level at the node A is reduced, and the transistor 821 is turned on to increase the voltage level at the node E. As the voltage level at the node B is increased, the transistor 822 is turned off, and as the voltage level at the node E is increased, the transistor 827 is turned on to reduce the voltage levels at the nodes C and D. The transistor 832 is turned off according to the reduced voltage level at the node D, and the transistor 831 is turned on according to the reduced voltage level at the node C so that the pixel capacitor (Cp) is charged with the first output voltage.

As shown in FIG. 17, when the voltage level that is input to the gate electrode of the transistor 811 is less than the voltage level that is input to the gate electrode of the transistor 812 in the input unit 810, the transistor 812 transmits the greater current I2 to the ground voltage (VSS) than that of the transistor 811 so that the voltage level at the node A becomes greater than the voltage level at the node B. In this instance, as the voltage level at the node A is increased, the transistor 821 is turned off to reduce the voltage at the node E. As the voltage level at the node B is reduced, the transistor 822 is turned on, and as the voltage level at the node E is reduced, the transistor 827 is turned off to increase the voltage levels at the nodes C and D. The transistor 831 is turned off according to the increased voltage level at the node C, and the transistor 832 is turned on according to the increased voltage level at the node D so that the first output voltage charged in the pixel capacitor (Cp) is discharged.

Figure 18:
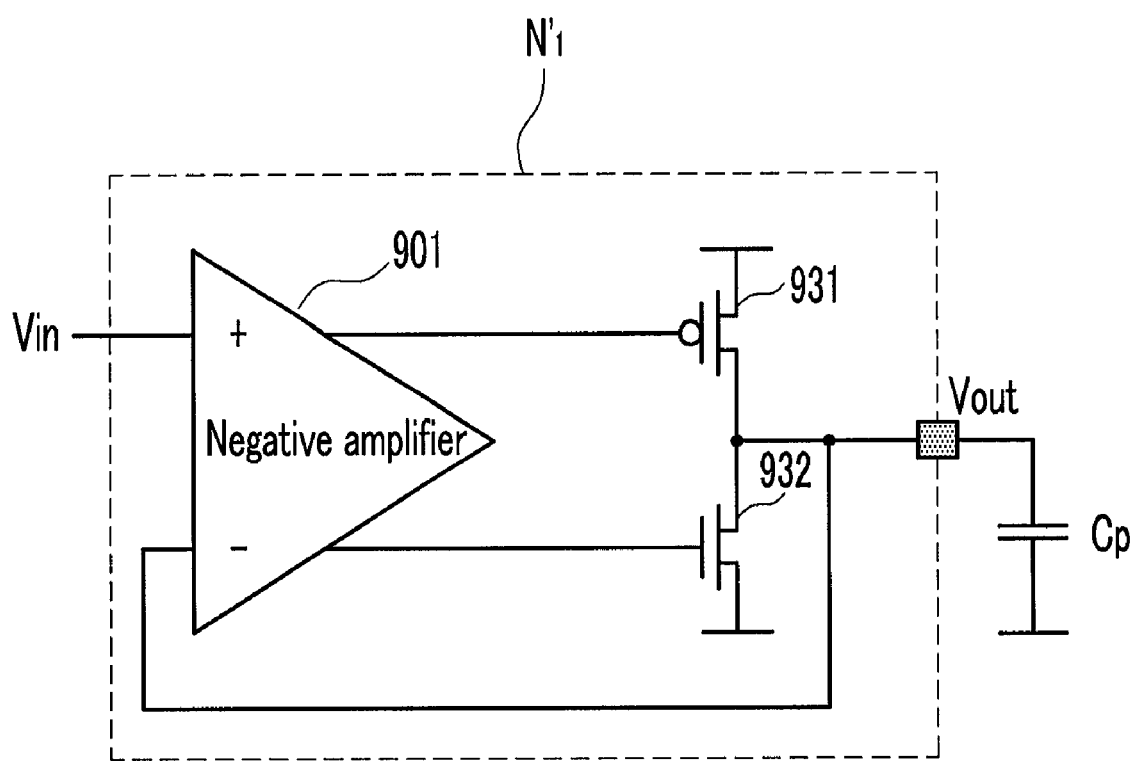
FIG. 18 shows a negative amplifying circuit according to a second exemplary embodiment of the present invention.
Figure 19:
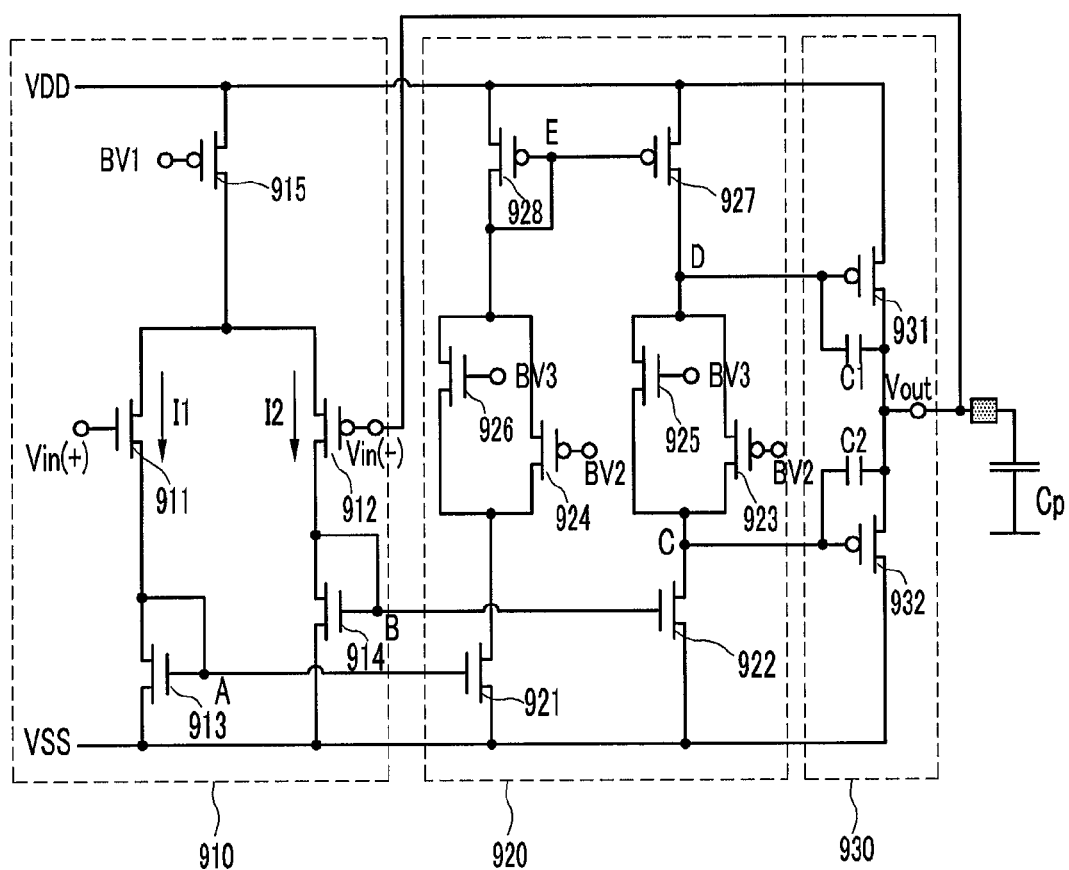
FIG. 19 shows a detailed negative amplifying circuit shown in FIG. 18.

FIG. 18 shows a negative amplifying circuit according to a second exemplary embodiment of the present invention, and FIG. 19 shows a detailed negative amplifying circuit shown in FIG. 18.

As shown in FIG. 18, the negative amplifying circuit ($N_1'$) according to the second exemplary embodiment of the present invention generates an output voltage by using a negative amplifier 901 and different types of transistors 931 and 932. The negative amplifying circuit ($N_1'$) transmits the generated output voltage to the pixel capacitor (Cp), and receives the same voltage as the voltage transmitted to the pixel capacitor (Cp) through the inverting input terminal (−) of the negative amplifying circuit ($N_1'$). In this instance, when the input voltage is applied to the non-inverting input terminal (+) of the negative amplifying circuit ($N_1'$), the voltage in the pixel capacitor (Cp) is charged or discharged according to the input voltage applied to the non-inverting input terminal (+) and the previous output voltage input to the inverting input terminal (−). That is, when a voltage that is greater than the voltage applied to the inverting input terminal (−) by a predetermined level is applied to the non-inverting input terminal (+), the negative amplifying circuit ($N_1'$) charges the pixel capacitor (Cp) with the voltage (hereinafter called the second output voltage) that is less than the common voltage (Vcom) by a predetermined level according to the voltages that are applied to the non-inverting input terminal (+) and the inverting input terminal (−). In this instance, when a voltage that is less than the voltage applied to the inverting input terminal (−) by a predetermined level is applied to the non-inverting input terminal (+), the negative amplifying circuit ($N_1'$) discharges the second output voltage charged in the pixel capacitor (Cp) according to the voltages applied to the non-inverting input terminal (+) and the inverting input terminal (−).

Figure 20:
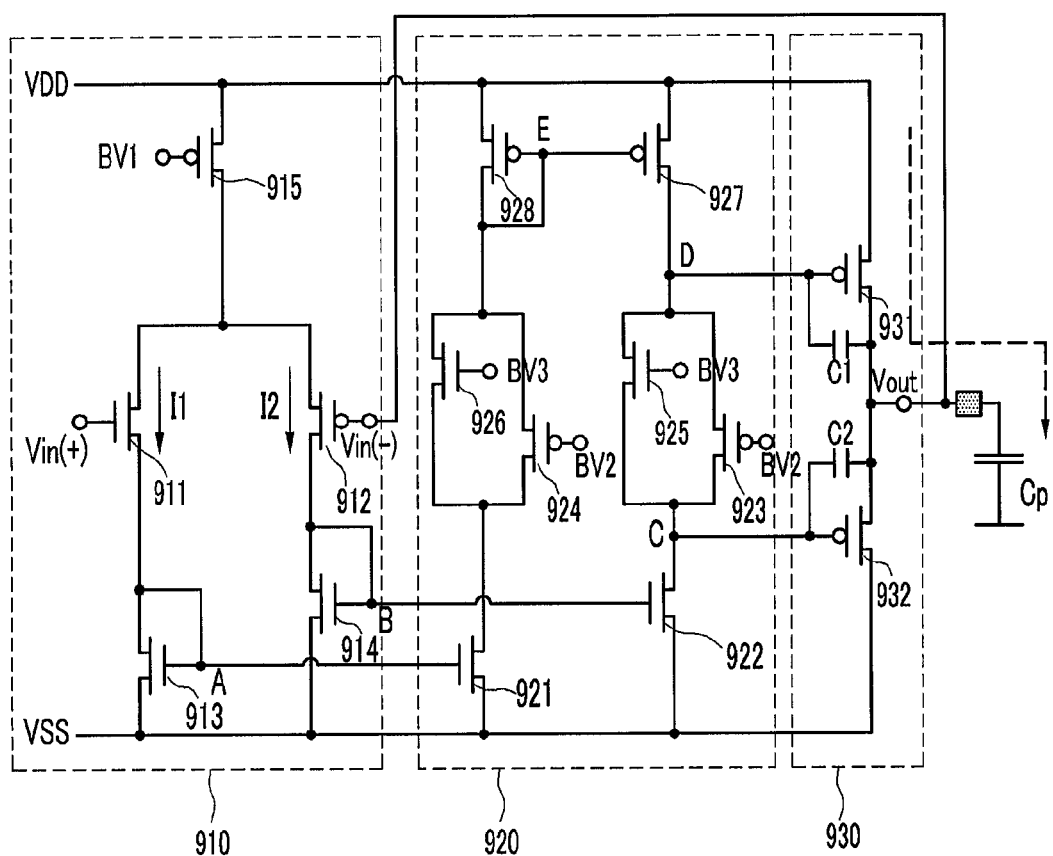
FIG. 20 and FIG. 21 show an operation of a negative amplifying circuit according to a second exemplary embodiment of the present invention.
Figure 21:
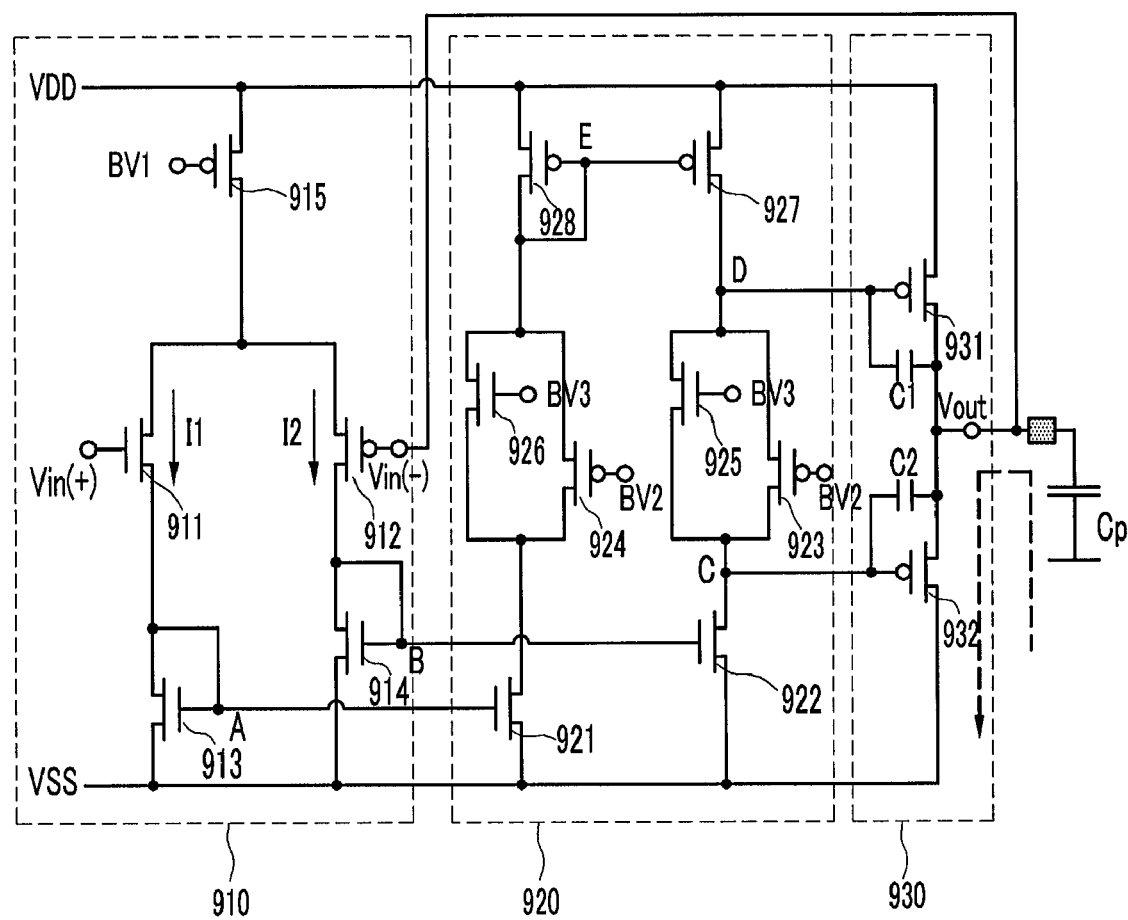

As shown in FIG. 19, since constituent elements of the negative amplifying circuit ($N_1'$) according to the second exemplary embodiment of the present invention use the constituent elements of the positive amplifying circuit ($P_1'$) and different types of transistors and corresponding constituent elements, no detailed description of the negative amplifying circuit shown in FIG. 19 will be provided. The connection states of the negative amplifying circuit ($N_1'$) formed by the different types of transistors 931 and 932 are different from those of the positive amplifying circuit ($P_1'$), but the differences are generated by the constituent elements according to the different transistor types and the position change of the constituent elements, and hence, the negative amplifying circuit shown in FIG. 20 and FIG. 21 will not be described.

Accordingly, since the positive and negative amplifying circuits according to the second exemplary embodiment of the present invention do not adopt the rail to rail structure but use a single input transistor, the area occupied by the input transistor is reduced compared to the conventional amplifying circuit, and the entire size of the amplifying circuit is reduced. That is, the conventional amplifying circuit adopting the rail to rail structure has increased the area occupied by the input transistor in the amplifying circuit in order to reduce the offset of the amplifying circuit, and the amplifying circuit adopting the single input transistor according to the exemplary embodiment of the present invention reduces the entire area of the amplifying circuit by the reduced area of the input transistor and thereby reduces the overall size of the amplifying circuit. Further, the positive and negative amplifying circuits according to the second exemplary embodiment of the present invention reduce the entire power consumption as the number of applied constant current sources is reduced. Also, since the positive and negative amplifying circuits according to the second exemplary embodiment of the present invention use different types of output transistors, the problem generated by the displayed video is solved by symmetrically maintaining the time for charging the output voltage and the time for discharging the same.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The amplifying circuit according to the exemplary embodiment of the present invention and a driving device of a display device using the same do not adopt the rail to rail structure but adopt the single input transistor structure to reduce the number of input transistors and accordingly reduce the area occupied by the input transistors in the amplifying circuit, thereby reducing the size of the entire amplifying circuit.

Also, as the number of constant current sources is reduced, he entire power consumption is reduced. Further, the time for charging the output voltage and the time for discharging the same can be symmetrically maintained by using the different types of output transistors.

The invention claimed is:

1. An amplifying circuit for a liquid crystal display including a plurality of pixels, the amplifying unit comprising:

an input unit, coupled between a first power source for supplying a first voltage and a second power source for supplying a second voltage, receiving a first input signal and a second input signal, and being controllable by the first and second input signals;

a bias unit receiving a bias voltage for operating the input unit, and including a first node and a second node controlled by the input unit; and an output unit for applying an output voltage to a selected pixel by using a first output transistor being turned on/off according to a signal applied to the first node and a second output transistor being turned on/off according to a signal applied to the second node, the second output transistor being different from the first output transistor, wherein the input unit includes:
a first input transistor having a first terminal coupled to the first power source and being turned on/off according to the first input signal; and
a second input transistor having a first terminal coupled to the first power source and being turned on/off according to the second input signal, the second input transistor being the same type as the first input transistor, wherein the bias unit includes:
a first transistor controlled by the on/off state of the first input transistor; and
a second transistor controlled by the on/off state of the second input transistor, wherein the bias unit includes:
a third transistor having a first terminal coupled to a first terminal of the first transistor and being turned on/off according to a third bias voltage;
a fourth transistor having a first terminal coupled to the first terminal of the first transistor and being turned on/off according to a fourth bias voltage;
a fifth transistor having a first terminal coupled to a first terminal of the second transistor and being turned on/off according to the third bias voltage;
a sixth transistor having a first terminal coupled to the first terminal of the second transistor and being turned on/off according to the fourth bias voltage;
a seventh transistor having (a) a first terminal coupled to a second terminal of the third transistor and also to a second terminal of the fourth transistor, and (b) a second terminal coupled to the second power source; and
an eighth transistor having (a) a gate electrode coupled to a gate electrode of the seventh transistor and (b) a first terminal coupled to a second terminal of the fifth transistor and also to a second terminal of the sixth transistor, and wherein the output voltage is applied to the input unit, such that one of the first and second input signals is equivalent to the output voltage.

2. The amplifying circuit of claim 1, wherein a period for charging the output voltage in the selected pixel and a period for discharging the output voltage charged in the selected pixel are symmetrically controlled by using the first and second output transistors.

3. The amplifying circuit of claim 1, wherein
the first voltage is a power source voltage VDD,
the second voltage is a ground voltage VSS, and
the output voltage is a first output voltage that is greater than a common voltage by a predetermined level.

4. The amplifying circuit of claim 3, wherein when a voltage level of the first input signal is greater than a voltage level of the second input signal, a voltage level of the signal applied to the first node is reduced to turn on the first output transistor, and the selected pixel is charged with the first output voltage through the first output transistor.

5. The amplifying circuit of claim 4, wherein when the voltage level of the first input signal is less than the voltage level of the second input signal, a voltage level of the signal applied to the second node is increased to turn on the second output transistor, and the first output voltage charged in the selected pixel is discharged through the second output transistor.

6. The amplifying circuit of claim 1, wherein
the first voltage is a ground voltage VSS,
the second voltage is a power source voltage VDD, and
the output voltage is a second output voltage that is less than a common voltage by a predetermined level.

7. The amplifying circuit of claim 6, wherein when a voltage level of the first input signal is less than a voltage level of the second input signal, a voltage level of the signal applied to the first node is increased to turn on the first output transistor, and the second output voltage charged in the selected pixel is discharged through the first output transistor.

8. The amplifying circuit of claim 7, wherein when the voltage level of the first input signal is greater than the voltage level of the second input signal, a voltage level of the signal applied to the second node is reduced to turn on the second output transistor, and the second output voltage is charged in the selected pixel through the second output transistor.

9. The amplifying circuit of claim 1, wherein
a gate electrode of the first output transistor is coupled to the first node between the first terminal of the second transistor and the first terminals of the fifth and sixth transistors, and
a gate electrode of the second output transistor is coupled to the second node between the second terminals of the fifth and the sixth transistors and the first terminal of the eighth transistor.

* * * * *